May 15, 1962 H. K. HAZEL 3,034,382

TRIM AND CLINCH DEVICE

Filed Nov. 7, 1960 2 Sheets-Sheet 1

INVENTOR
H. KEN HAZEL

BY J T Comfort
ATTORNEY

May 15, 1962 H. K. HAZEL 3,034,382

TRIM AND CLINCH DEVICE

Filed Nov. 7, 1960 2 Sheets-Sheet 2

United States Patent Office 3,034,382

Patented May 15, 1962

3,034,382

TRIM AND CLINCH DEVICE

Herbert Kenneth Hazel, Lake Katrine, N.Y., assignor to International Business Machines Corporation, New York, N.Y., a corporation of New York Filed Nov. 7, 1960, Ser. No. 67,638

3 Claims. (Cl. 78—1)

This invention is directed to a device for securing components to a substantially rigid board and more particularly to a trim and clinch tool for trimming and clinching electronic component leads to a printed circuit board.

Printed circuit boards have come into widespread use in the electronic industry to provide support for, and interconnection between, electronic components in the formation of electronic circuits. Heretofore, electronic components have at times been combined with the printed circuit boards by several separate operations such as (1) inserting component leads in holes formed in the lands of the printed circuitry, (2) holding the component in place temporarily, (3) trimming the component leads to the desired length, and (4) clinching the leads to the printed circuit boards. Such multiple operations may be slow or inefficient. Further the separate operations of trimming and clinching require that long lead lengths be left after trimming to allow the clinching tool to engage the lead. This results in large and often uneven foldovers. Such large and uneven foldovers (which often extend beyond the periphery of the circuit lands) cause many short circuits due to solder flow from a lead foldover to an adjacent circuit line during the subsequent dip solder operation.

An object of this invention is to provide a new and improved device for securing components to a substantially rigid board in a fast and efficient manner.

Another object of this invention is to provide a new and improved device for securing components to a printed circuit board.

A further object of this invention is to provide a new and improved device for securing components to a printed circuit board in a single operation.

Yet another object of this invention is to provide a new and improved device for securing component leads to a printed circuit board with a minimum controllable foldover length.

Still another object of this invention is to secure components to a printed circuit board in a manner to prevent unwanted solder flow on the printed circuit board.

Briefly then this invention is practiced by providing a trimming device having first and second elements. The first element has a first face terminating at a cutting edge, the cutting edge being spaced apart from the surface of a printed circuit board and adjacent to a rod such as a component lead to be trimmed which extends through that board. The second element is movable with respect to said first element along a line defining an oblique angle with respect to said printed circuit board and past the cutting edge of the first element and in the direction of the printed circuit board in order to trim the component lead to a predictable length and establish an end to the component lead. The second element has a swedge end for engaging the component lead at a point substantially adjacent to the cutting edge of the first element so that the continued movement of the second element past the cutting edge of the first element causes the trimmed end of the component lead to cold flow and effect a clinch between the trimmed end of the component lead and the printed circuit board.

A device constructed in accordance with the principles of this invention is fast and efficient. The trimming and clinching is effected in a single operation with a minimum controllable foldover length resulting. The unwanted flow of solder is largely eliminated by the small, uniform size of the clinched ends of the component leads.

The foregoing and other objects, features and advantages of the invention will be apparent from the following more particular description of a preferred embodiment of the invention, as illustrated in the accompanying drawings.

Reference is now made to the drawings which illustrate a preferred embodiment of the invention.

Figure 1:
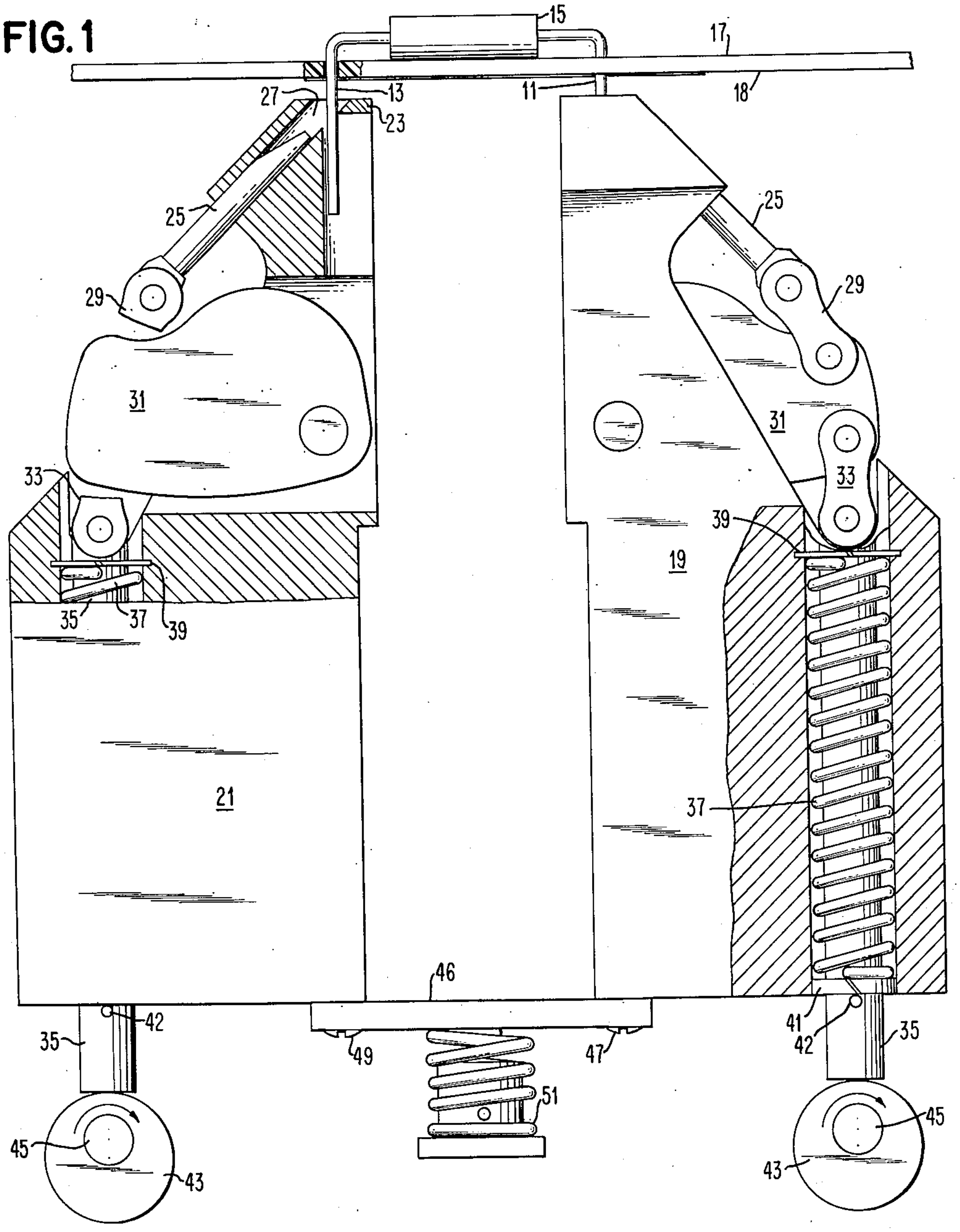
FIG. 1 shows a partially cutaway side view of two trim and clinch devices constructed in accordance with the principles of this invention.

Referring first to FIG. 1, printed circuit board 17 is a conventional single-sided printed circuit board having a lower surface 18 with holes formed in the lands of the printed circuits. Printed circuit boards, their use, characteristics and methods of fabrication are well known. The printed circuitry on surface 18 of board 17 defines electrical connections between electronic components 15 having leads 11 and 13 extending through holes in board 17. As the immediate description is concerned with the manner in which components are secured to the board to enable component leads to make electrical connection with the printed circuits, the printed circuit board itself is not further described.

Normally one trim and clinch device such as devices 19 and 21 is provided for each component lead to be secured to printed circuit board 17. As trim and clinch devices 19 and 21 are substantially the same, the same reference numerals are applied to equivalent parts of both devices. In order to better explain the principles of the present invention, in FIG. 1 different portions of devices 19 and 21 are shown cut away and the following description applies to the device shown with the appropriate parts cut away. Leads 11 and 13 of electronic component 15 are shown inserted through holes in printed circuit board 17 and interposed between first trimmer elements 23 and second trimmer elements 25 which are movable with respect to first trimmer elements 23 in the manner presently described. Movable trimmer elements 25 are journaled for free movement along the length of passageways 27 within elements 19 and 21 and are coupled by drive links 29 to lead ejectors 31. Ejectors 31 in turn are coupled by drive links 33 to drive rods 35. Springs 37 compressed between stops 39 (secured to the body portion of device 19) and stops 41 (secured by pins 42 on drive rods 35) urge drive rods 35 in a downward direction. Transverse bar 46 biased in a downward direction by spring 51 is secured to the body portion of devices 19 and 21 by screws 47 and 49 and urges the devices 19 and 21 in a downward direction. Eccentric cams 43 are rotated in a clockwise direction by shafts 45 to drive devices 19 and 21. Devices 19 and 21 are enclosed in a supporting structure of conventional design (not shown), and are reciprocally driven in upward and downward movements. It is during each such movements that the operation of the trim and clinch devices is effected in the manner next described.

It is assumed that eccentric cams 43 rotate in substantial synchronism in a clockwise direction. As cams 43 rotate, drive rods 35 are urged upwardly, causing devices 19 and 21 to also move upwardly until contact is made between the upper surface of elements 23 and the surface 18 of printed circuit board 17. A stop on the supporting structure (not shown) enclosing devices 19 and 21 stops the upward movement of devices 19 and 21 after contact is made with the surface 18 of printed circuit board 17. The trim and clinch devices are first moved upwardly in the manner described because springs 37 are stronger than springs 51 and springs 51 are expanded before springs 37 are compressed. The continued rotation of cams 43 after contact between element 23 and board 17 has been established and the upward movement of devices 19 and 21 has stopped, causes springs 37 to be compressed, thus urging drive rods 35 in an upward direction with respect to the bodies of devices 19 and 21. The movement of drive rods 35 relative to devices 19 and 21 causes movable trimmers 25 to be advanced in passageways 27 in the direction of leads 11 and 13.

The trim and clinch operation is next described in a step by step manner with reference to FIGS. 2 through 7. In FIGS. 2 through 7 partial, cutaway views of trim and clinch device 21 show the progressive relationship between the movable trimmer element 25, fixed trimmer element 23, component lead 13 and printed circuit board 17 as a lead is trimmed and clinched.

Figure 2:
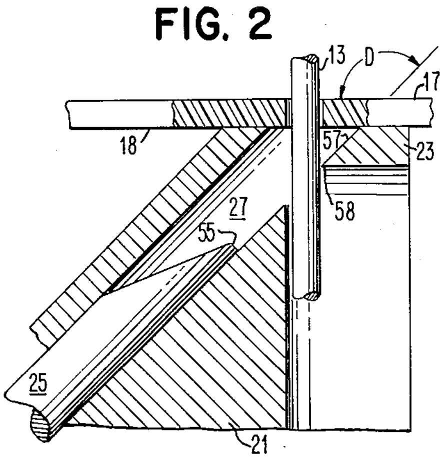
FIGS. 2 through 7 show progressively the relationship between the fixed and movable trimmers as a component lead is trimmed and clinched to a printed circuit board.

Referring first to FIG. 2, lead 13 has been inserted in the hole formed in printed circuit board 17 and is positioned between elements 23 and 25 at the time that devices 19 and 21 have been upwardly advanced to abut against the lower surface 18 of board 17. It is pointed out that element 23 includes a face 57 which terminates in cutting edge 58, the face and cutting edge being spaced apart from surface 18. It is further pointed out that passageway 27 and therefore the movement of element 25 extends in a direction that forms an oblique angle D with respect to surface 18 of board 17. The rotation of cam 43 (in FIG. 1) causes movable trimmer 25 to advance towards the lower surface of the printed circuit board.

Figure 3:
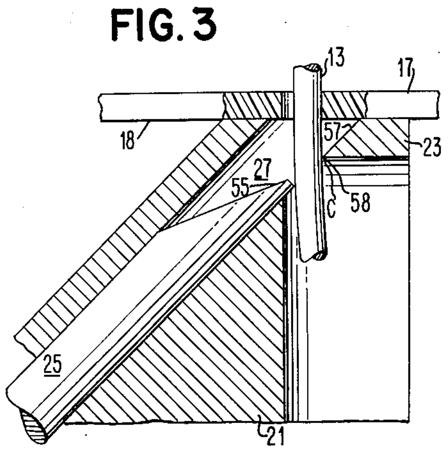
Figure 4:
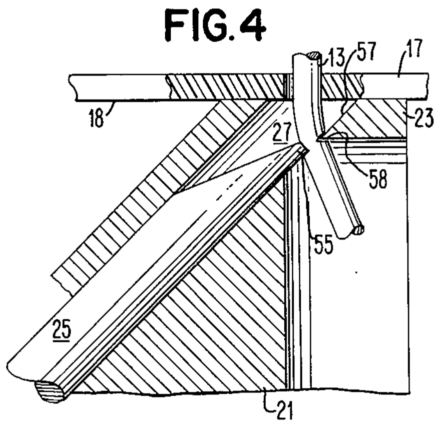

As shown in FIG. 3, movable trimmer 25 is advanced to entrap lead 13 between elements 25 and 23 and therewith bend the lead slightly at a point C. The continued movement of movable trimmer 25 in FIG. 4 causes engagement with and bending of lead 13. This added movement causes swedge end 55 of movable trimmer element 25 to bite into and therewith engage lead 13.

Figure 5:
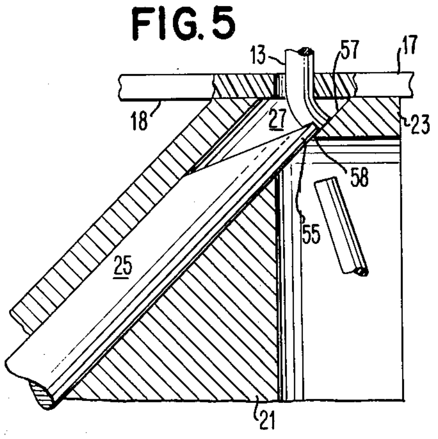
Figure 6:
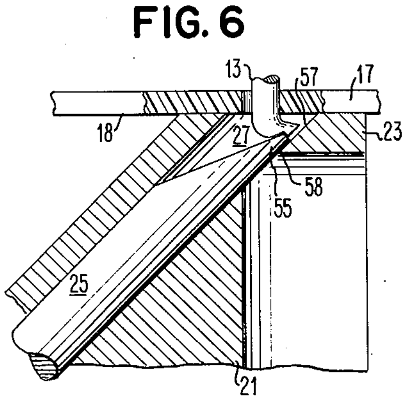
Figure 7:
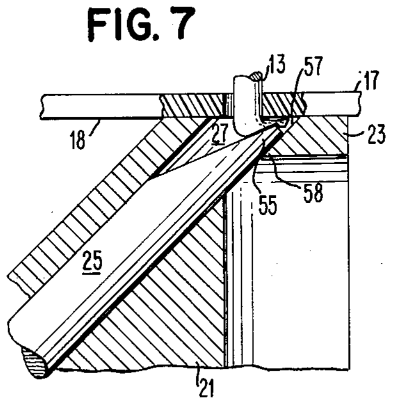

As shown in FIGS. 5 and 6, the continued movement of element 25 severs the lower end of lead 13 and swedge end 55 of movable trimmer 23 cold forms the newly established trimmed end of lead 13 by virtue of the purchase swedge end 55 has on the new end of lead 13. The continued movement of element 25 in the direction of surface 18 exerts a lateral force on lead 13 subsequent to the trimming operation to carry the end of lead 13 toward surface 18 and to insure that lead 13 is not forced out of the hole in board 17. By the use of this apparatus, it is not necessary to exert a separate downward force on component 15 in order to hold the component in place during trimming. In FIG. 6, lead 13 is shown almost clinched to printed circuit board 17 with swedge end 55 still engaged in the trimmed end of lead 13 to insure that the lead is clinched to the printed circuit board. In FIG. 7, lead 13 is clinched to the printed circuit board. Surface 18 and the face 57 of element 23 define a space within which the lead is clinched and further serves to restrict the size and shape of the clinched end of lead 13.

The continued rotation of cams 43 in FIG. 1 from the high dwell relieves the tension on springs 37. Springs 37 thereupon urge drive rods 35 in a downwardly direction withdrawing elements 25 in passageways 27 in anticipation of the next trim and clinch operation.

The operation of the cut off and clinch device has been shown progressively in FIGS. 2 through 7. It has thus been pointed out that the combination of the two trimmers, one fixed and one moving, with the moving trimmer terminated in a blunt tip to engage a purchase in the lead, trims and clinches the lead to the printed circuit board in a single operation. If the moving trimmer was not terminated in a blunt tip the lead would be cut but would tend to be forced out of the hole. When more than one component lead is clinched at a time the trim and clinch devices may be operated in synchronism to insure that the leads are cut off and clinched with an equal force.

The provision of fixed and movable trimmer elements enables the devices to be placed close together along the length of the component so very small components may be handled. The provision of only one movable trimmer element reduces the wear on the device and makes it unnecessary to constantly adjust the trimmer elements.

While the invention has been particularly shown and described with reference to a preferred embodiment thereof, it will be understood by those skilled in the art that various changes in form and details may be made therein without departing from the spirit and scope of the invention.

What is claimed is:

1. A device for trimming and clinching a rod extending through a board in a direction substantially normal to the surface of said board, comprising,
   - a first element having a face terminating at a cutting edge spaced apart from said board surface and adjacent to said rod,
   - a second element movable with respect to said first along a line defining an oblique angle with respect to said board surface and past the cutting edge of said first element,
   - a swedge end on said second element for engaging said rod at a point substantially adjacent to said cutting edge of said first element,
   - and means for moving said second element past said cutting edge with respect to said board in order to trim said rod to a predictable length, thereby establishing an end on said rod, and cause the trimmed end of said rod to cold flow in the direction of said board so that a clinch is effected between the trimmed end of said rod and said board.

2. A device for trimming and clinching a rod extending through a board in a direction substantially normal to a surface of said board, comprising,
   - a fixed element having a face terminating at a cutting edge spaced apart from said board surface and adjacent to said rod,
   - a movable element movable with respect to said fixed element along a line defining an oblique angle with respect to said board,
   - a swedge end on said movable element for engaging said rod at a point substantially adjacent to said cutting edge of said fixed element,
   - and means for moving said movable element past said cutting edge with respect to said board in order to trim said rod to a predictable length, establishing an end on said rod, the movement of said swedge end engaged in the trimmed end of said rod past said cutting edge causing the trimmed end of said rod to cold flow in the direction of said board so that a clinch is effected between the trimmed end of said rod and said board.

3. A device for trimming and clinching a rod extending through a board substantially in a direction normal to a surface of said board, comprising, a first element having a face terminating at a cutting edge spaced apart from said board surface and adjacent to said rod, a second element movable with respect to said first element along a line defining an oblique angle with respect to said board surface and past the cutting edge of said first element, a swedge end on said second element for engaging said rod at a point substantially adjacent to said cutting edge of said first element, said face of said first element and said board defining a space adjacent to said rod, and means for moving said second element beyond said cutting edge with respect to said board in order to trim said rod to a predictable length and therewith establish an end on said rod and cause the trimmed end of said rod to cold flow in the direction of said board so that a clinch is effected between the trimmed end of said rod and said board in said defining space.

No references cited.